(12) United States Patent
Yang

(10) Patent No.: US 7,781,275 B2
(45) Date of Patent: Aug. 24, 2010

(54) METHOD OF MANUFACTURING A FLASH MEMORY DEVICE

(75) Inventor: Young Ho Yang, Cheongju-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 668 days.

(21) Appl. No.: 11/758,509

(22) Filed: Jun. 5, 2007

(65) Prior Publication Data

US 2008/0128778 A1  Jun. 5, 2008

(30) Foreign Application Priority Data

Dec. 4, 2006  (KR)  ...................... 10-2006-0121518

(51) Int. Cl.
*H01L 21/00* (2006.01)
(52) U.S. Cl. ........................... 438/164; 438/39; 438/42; 438/201; 438/257; 257/314; 257/E21.89
(58) Field of Classification Search ................... 438/39, 438/42, 164, 201, 257, 593, FOR. 203, FOR. 123; 257/314, E21.69
See application file for complete search history.

(56) References Cited

U.S. PATENT DOCUMENTS

2002/0192887 A1* 12/2002 Adachi et al. ............... 438/197
2004/0178470 A1* 9/2004 Hieda .......................... 257/510
2004/0261111 A1* 12/2004 Aboulgasem et al. ......... 725/86
2006/0220098 A1* 10/2006 Lee et al. ..................... 257/315
2007/0059945 A1* 3/2007 Mohklesi ..................... 438/778

FOREIGN PATENT DOCUMENTS

| CN | 1790716 | 6/2006 |
| CN | 1858901 | 11/2006 |
| JP | 2000-174236 | 6/2000 |
| KR | 10-1998-0072838 | 11/1998 |
| KR | 10-1999-0015794 | 3/1999 |
| KR | 10-2005-0002089 | 1/2005 |
| KR | 10-2006-0111221 | 10/2006 |
| KR | 10-2006-0120977 | 11/2006 |
| KR | 10-2007-0004351 | 1/2007 |
| KR | 10-2007-0072680 | 7/2007 |

* cited by examiner

*Primary Examiner*—Thanh V Pham
(74) *Attorney, Agent, or Firm*—Marshall, Gerstein & Borun LLP

(57) ABSTRACT

A method of manufacturing a flash memory device is disclosed. The method includes the steps of providing a semiconductor substrate in which a cell region and a select transistor region are defined, etching the semiconductor substrate in the select transistor region so that there is a first step between the cell region and the select transistor region, forming a cell gate in the cell region, and forming a transistor in the select transistor region.

12 Claims, 3 Drawing Sheets

METHOD OF MANUFACTURING A FLASH MEMORY DEVICE

CROSS-REFERENCE TO RELATED APPLICATIONS

The priority of Korean patent application number 10-2006-121518, filed on Dec. 4, 2006, the disclosure of which is incorporated by reference in its entirety, is claimed.

BACKGROUND OF THE INVENTION

The invention relates, in general, to flash memory devices and, more particularly, to a method of manufacturing a flash memory device that reduces an undesirable interference phenomenon.

Semiconductor memory devices for storing data can be largely classified into volatile memory devices or nonvolatile memory devices. Volatile memory devices lose their data when the supply of power thereto is stopped, whereas nonvolatile memory devices retain their data in the absence of power.

Each nonvolatile memory device includes a flash memory device. A unit cell of the flash memory device generally includes an active region defined on a specific region of a semiconductor substrate, a tunnel insulating layer formed on the active region, a floating gate formed on the tunnel insulating layer, a gate interlayer insulating layer formed on the floating gate, and a control gate electrode formed on the gate interlayer insulating layer. In particular, the flash memory device has been widely used for MP3 players, digital cameras, memory for computer BIOS storage, mobile phones, portable data storage devices and so on.

The flash memory cell can store data as voltage externally applied to the control gate electrode is coupled to the floating gate. Accordingly, when storing data for a short period of time and at a low program voltage, the ratio of voltage applied to the control gate electrode to voltage applied to the floating gate must be high. The ratio of voltage applied to the control gate electrode to voltage applied to the floating gate is called the coupling ratio ("CR"). Furthermore, the coupling ratio can be expressed by the ratio of the capacitance of the gate interlayer insulating layer to the sum of the capacitance of the tunnel insulating layer and the gate interlayer insulating layer.

In current flash memory manufacturing methods, the space where a unit active region and a unit field region will be formed narrows as devices become more highly integrated. When a dielectric layer, a control gate and a floating gate are formed within a narrow active space, the distance between the gates is narrowed, so that the interference phenomenon becomes increasingly problematic. In particular, in order to develop a Multi-Level Cell (MLC) in a general NAND flash memory device employing an Advanced Self-Aligned Shallow Trench Isolation (ASA-STI) method, interference charges between the floating gates must be reduced.

A conventional method of manufacturing a flash memory device is briefly described below.

In order to minimize the damage to a semiconductor substrate resulting from an ion implant process, a buffer insulating layer is formed on the semiconductor substrate. The buffer insulating layer is formed from an oxide layer. After the ion implant process is performed, the buffer insulating layer is removed. After a tunnel insulating layer is formed over the semiconductor substrate, an annealing process is performed. The tunnel insulating layer is formed by performing a wet or dry oxidization process at a temperature ranging from 750° C. to 850° C. using $H_2$ or $O_2$. The annealing process is performed in order to eliminate the trap phenomenon occurring at the interface between the semiconductor substrate and the tunnel insulating layer and to increase the data storage ability of the transistor. The annealing process includes a post-anneal process at a temperature ranging from 750° C. to 1100° C. using $N_2$, $N_2O$, or NO.

A first conductive layer for a floating gate is formed on the tunnel insulating layer. The first conductive layer is formed by in-situ implanting a P or B dopant into a source gas of $SiH_4$, $Si_2H_6$, or $SiH_2Cl_2$. A first hard mask layer having a stack structure of an oxide layer and a nitride layer is formed on the first conductive layer. The first hard mask layer, the first conductive layer, the tunnel insulating layer, and the semiconductor substrate are partially etched by a photo and development processes, thereby forming trenches and also a floating gate consisting of the first conductive layer.

A first insulating layer is formed over the semiconductor substrate including the trenches so that the trenches are filled. The first insulating layer is polished to form isolation layers. The first insulating layer is polished using a High Density Plasma (HDP) oxide layer or Spin on Glass (SOG). In order to control the Effective Field Height (EFH) of the isolation layers, a wet etch process (i.e., a cleaning process) is performed to partially remove the top surface of the isolation layers.

A dielectric layer is formed over the semiconductor substrate including the isolation layers and the first conductive layer. An annealing process and an oxidization process are carried out at a temperature ranging from 600° C. to 900° C. using $O_2$ or $H_2$. A second conductive layer for a control gate and a second hard mask layer are formed over the dielectric layer. The second conductive layer has a stacked structure including a polysilicon layer and a tungsten silicide ($WSi_x$) layer or tungsten (W). The second hard mask layer is formed from an oxide layer or a silicon oxynitride (SiON) layer. The second hard mask layer, the second conductive layer, the dielectric layer and the first conductive layer are etched through photo and development processes, thereby forming gates.

Spacers for separating the gates are formed on the sides of the gates. In order to protect a cell gate, a second insulating layer is formed over the semiconductor substrate including the spacers and the gates. The second insulating layer is formed from an oxide layer or a nitride layer.

A first insulating layer having a source contact plug formed therein is formed on the second insulating layer. A second insulating layer having a drain contact plug formed therein is formed over the semiconductor substrate including the source contact plug and the first insulating layer. The source contact plug and the drain contact plug are formed from polysilicon or tungsten. In order to store data in the cell gate and transfer external voltage to the source contact plug and the drain contact plug formed so as to read stored data, metal lines are formed on the second insulating layer.

Today, in a flash memory device, in order to select a specific cell gate, voltage is applied to the SSL and the metal line, and current flows through the cell gate due to a difference between applied voltages. In order for the current to flow through only the cell gate, the select transistor, such as the Source Select Line (SSL) or the drain select line (DSL), are used. However, an interference phenomenon occurs between the select transistor and the cell gate that is the nearest to the select transistor due to voltage applied to turn on/off the select transistor. Accordingly, the current properties of the gate around the select transistor are changed, causing a large amount or small amount of current to flow. This results in defective cell properties.

SUMMARY OF THE INVENTION

Accordingly, the invention addresses the above problems and discloses a method of manufacturing a flash memory device that reduces the interference phenomenon between a select transistor and a cell gate in such a manner that a cell region and a select transistor region have a step created by partially etching the select transistor region of a semiconductor substrate (i.e., a region where a Source Select Line (SSL) and a Drain Select Line (DSL) are formed).

According to an aspect of the invention, there is provided a method of manufacturing a flash memory device, including the steps of providing a semiconductor substrate in which a cell region and a select transistor region are defined, etching the semiconductor substrate in the select transistor region so that there is a first step between the cell region and the select transistor region, forming a cell gate in the cell region, and forming a transistor in the select transistor region.

According to another aspect of the invention, there is provided a flash memory device, including a semiconductor substrate having a step between a cell region and a select transistor region, a transistor formed in the select transistor region, and a memory cell formed in the cell region.

DETAILED DESCRIPTION OF EMBODIMENTS

Now, a specific embodiment according to the invention is described with reference to the accompanying drawings.

Figure 1A:
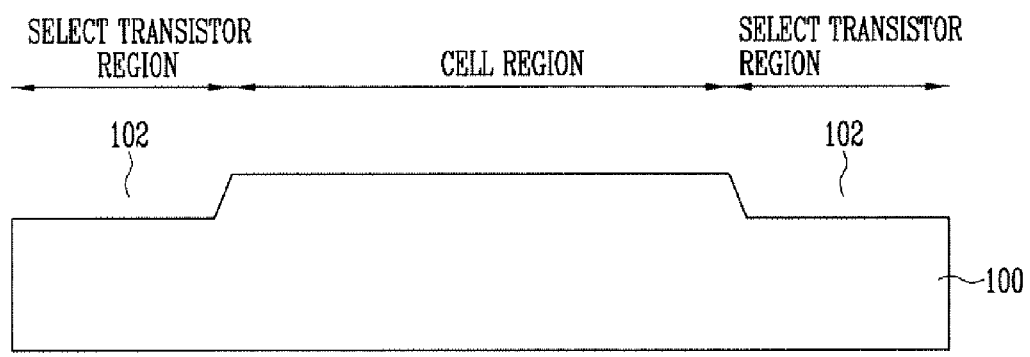
FIGS. 1A to 1E are cross-sectional views illustrating a method of manufacturing a flash memory device according to an embodiment of the invention.

Referring to FIG. 1A, a first insulating layer (not shown) is formed on a semiconductor substrate 100 in order to minimize damage to the semiconductor substrate resulting from an ion implant process. The first insulating layer can be formed at a thickness of 50 Å to 200 Å using an oxide layer or a nitride layer. In order to define a cell region and a peri region, an N-type or P-type impurity is implanted into the semiconductor substrate 100, and the first insulating layer is then removed.

A select transistor region (i.e., a region of the semiconductor substrate 100 in which a SSL and a DSL will be formed) is partially etched to form first trenches 102. The width of the first trenches 102 can be set to 4 to 6 times larger than that of the SSL or the DSL, and the depth of the first trenches 102 can range from 300 Å to 1000 Å. When forming the first trenches 102, the side of the first trenches 102 is sloped not vertical. The angle of the slope can be controlled depending on the polymer formation method and the corresponding amount of polymer used when etching the semiconductor substrate 100. The side of the first trenches 102 is sloped so that it can provide good etching selectivity when etching steps are performed subsequent to the deposition of several additional layers. The first trenches 102 formed in the select transistor region define a step formed between the cell region and the select transistor region.

Figure 1B:
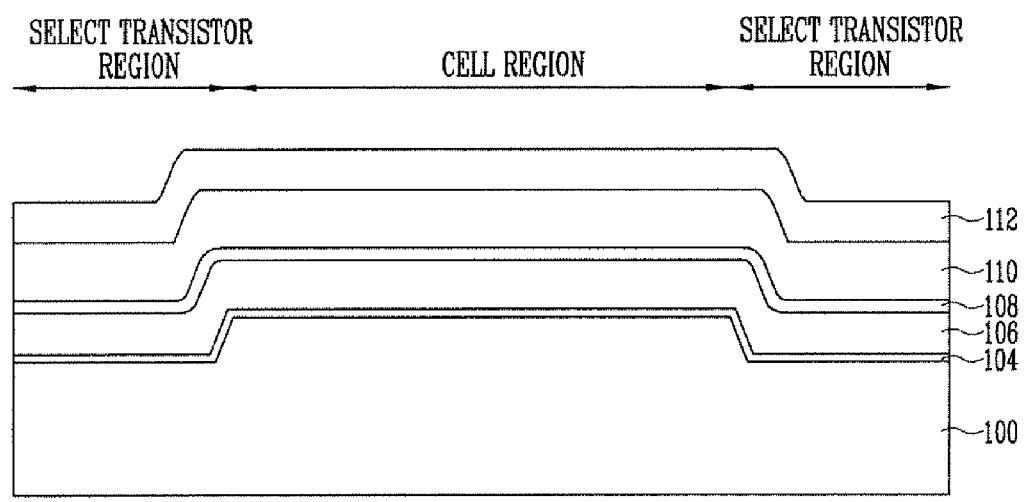

Referring to FIG. 1B, a tunnel insulating layer 104 is formed over the semiconductor substrate 100 including the first trenches 102. In order to prevent a trap phenomenon from occurring at the interface of the semiconductor substrate 100 and the tunnel insulating layer 104 and to increase the data storage ability of the transistor, an annealing process is performed. The tunnel insulating layer 104 can be formed by performing a wet or dry oxidization process at a temperature ranging from 750° C. to 850° C. using $H_2$ or $O_2$. The annealing process can be performed as a post annealing process at a temperature ranging from 750° C. to 1100° C. using $N_2$, $N_2O$, or NO.

A first conductive layer 106 for a floating gate and a first hard mask layer (not shown) are formed on the tunnel insulating layer 104. The first conductive layer 106 can be formed from a polysilicon layer by in-situ implantation of a Phosphorous(P) or Boron(B) dopant into a source gas, such as $SiH_4$, $Si_2H_6$, or $SiH_2Cl_2$. The first hard mask layer can be formed using a single pad oxide layer, a single nitride layer, or a stacked layer including a pad oxide layer and a nitride layer.

The first hard mask layer, the first conductive layer 106, the tunnel insulating layer 104 and the semiconductor substrate 100 are partially etched through photo and development processes, thereby forming second trenches (not shown) for isolation layers (not shown) and also a floating gate pattern (not shown) comprising the first conductive layer 106.

A second insulating layer is formed over the semiconductor substrate 100 including the second trenches so that the second trenches are filled. The second insulating layer is then polished to form the isolation layers. The second insulating layer can be formed from an HDP oxide layer or SOG. In order to control the EFH of the isolation layer, a wet etch process (i.e., a cleaning process) is performed to partially remove the top surface of the isolation layer.

A dielectric layer 108 is formed over the semiconductor substrate 100 including the isolation layer and the first conductive layer 106. An annealing process and an oxidization process are then performed. The annealing process can be performed at a temperature ranging from 600° C. to 900° C. using $O_2$ or $H_2$.

A second conductive layer 110 for a control gate and a second hard mask layer 112 are formed over the dielectric layer 108. The second conductive layer 110 can have a structure in which a polysilicon layer is stacked with a tungsten silicide ($WSi_x$) layer or a tungsten (W) layer. The second hard mask layer 112 can be formed from an oxide layer or a silicon oxynitride (SiON) layer.

Figure 1C:
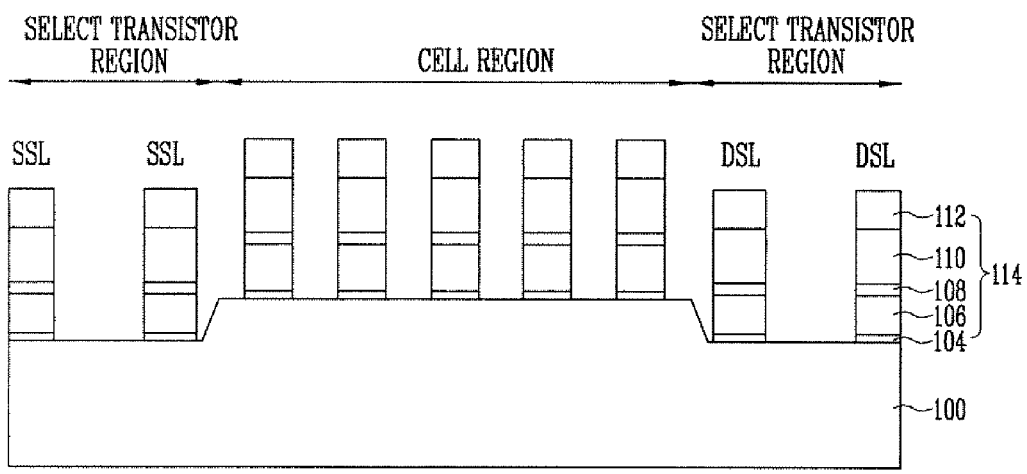

Referring to FIG. 1C, the second hard mask layer 112, the second conductive layer 110, the dielectric layer 108, the first conductive layer 106 and the tunnel insulating layer 104 are sequentially etched through photo and development processes, thereby forming gates 114 in which the tunnel insulating layer 104, the first conductive layer 106, the dielectric layer 108, the second conductive layer 110 and the second hard mask layer 112 are stacked.

When cell gates 114 (i.e., the gates 114 in the cell region) are formed, a SSL and a DSL (which have the same stacked structure as the cell gates 114) are also formed at the same time in the select transistor region (i.e., the region in which the first trenches 102 are formed). A step is formed between the cell gates 114 in the cell region, and the SSL or the DSL formed in the select transistor region due to the first trenches 102.

Figure 1D:
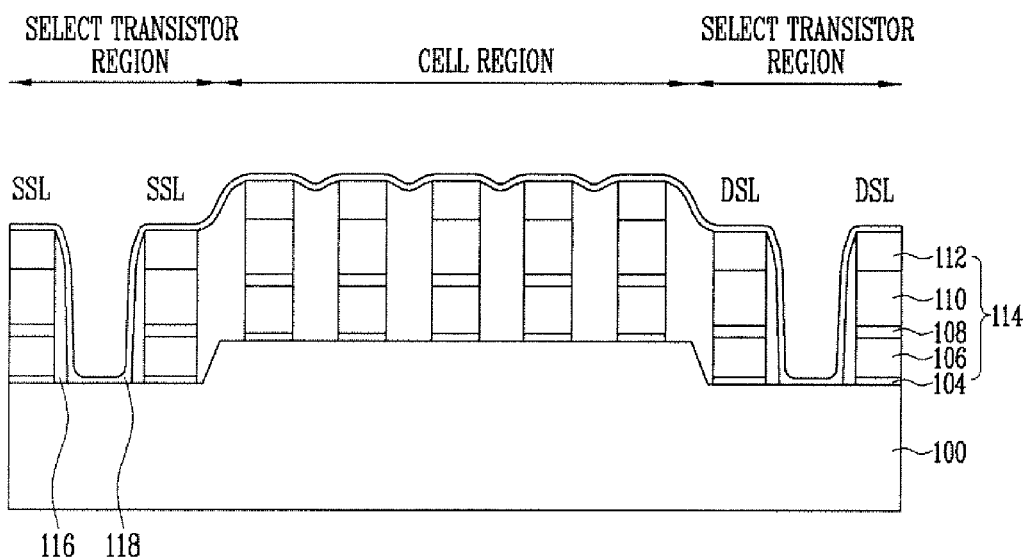

Referring to FIG. 1D, a re-oxidation process is performed in order to eliminate damage occurring in the etch process for forming the gate 114. In order to separate the gates 114, spacers 116 are formed on the sides of the gates 114. In order to protect the cell gates 114, a third insulating layer 118 is formed over the semiconductor substrate 100 including the spacer 116 and the gates 114. The third insulating layer 118 can be formed from an oxide layer or a nitride layer.

Figure 1E:
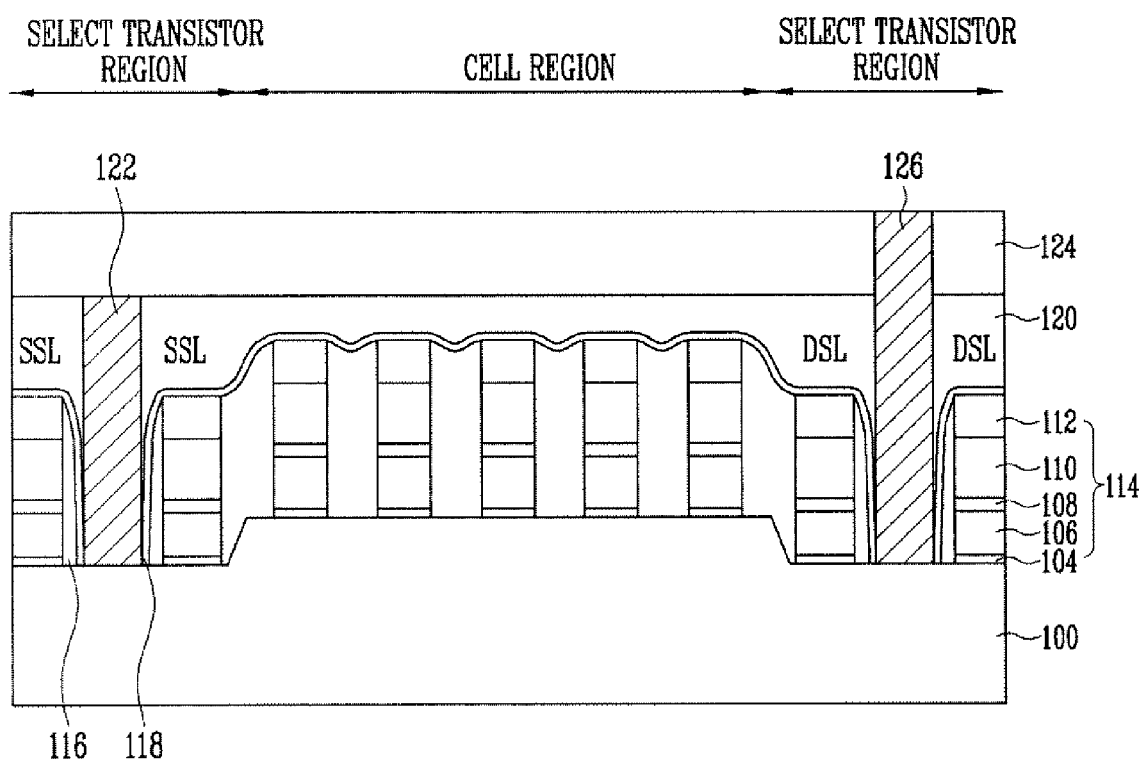

Referring to FIG. 1E, a first insulating layer 120 is formed on the third insulating layer 118. When the first insulating layer 120 is formed, there is a step in the select transistor region. The first insulating layer 120 can be polished using a Chemical Mechanical Polishing (CMP) process to remove the step.

The first insulating layer 120 is etched to form a source contact hole in a source retion between the SSLs of the select transistor region. The source contact hole is filled with a third conductive layer to form a source contact plug 122. The third conductive layer can be formed from polysilicon or tungsten (W).

Thereafter, a second insulating layer 124 is formed over the semiconductor substrate 100 including the source contact plug 122 and the first insulating layer 120. A CMP process is then performed to polish the second insulating layer 124. When the second insulating layer 124 is formed, there is a step in the select transistor region. In this case, if a photoresist pattern for forming a drain contact hole is formed without first removing the step, the photoresist pattern will also have a step, preventing the etch process from being properly performed. Furthermore, if the etch process is not properly performed, metal material partially remains, thereby degrading the cell properties.

The second insulating layer 124 and the first insulating layer 120 are etched by means of photo and development processes, thereby forming a drain contact hole in a drain region between the DSLs of the select transistor region. A fourth conductive layer is then formed over the semiconductor substrate 100 including the drain contact hole so that the drain contact hole is filled. The fourth conductive layer can be formed from polysilicon or tungsten (W).

A polishing process is then performed until the top surface of the second insulating layer 124 is exposed, thereby forming a drain contact plug 126.

As described above, the invention has the following advantages.

First, the cell region and the select transistor region are formed to have a step by partially etching the select transistor region of a semiconductor substrate (i.e., the region in which the SSL and the DSL are formed). Accordingly, the interference phenomenon between the select transistor and the cell gate nearest to the select transistor can be improved.

Second, by reducing the interference phenomenon the width between the select transistor and the cell gate nearest to the select transistor can be reduced significantly.

Third, by reducing the interference phenomenon, the cell properties can be prevented from becoming defective since a large amount or a small amount of voltage flows due to changed current properties of a cell gate near a select transistor.

Fourth, a retention characteristic of the select transistor and the cell gate nearest to the select transistor can be improved.

Fifth, by improving the interference phenomenon, a program characteristic of the cell gate can become uniform.

Although the foregoing description has been made with reference to the various embodiments, it is to be understood that changes and modifications of the disclosure may be made by the skilled artisan without departing from the spirit and scope of the disclosure and appended claims.

What is claimed is:

1. A method of manufacturing a flash memory device, comprising the steps of:
   providing a semiconductor substrate in which a cell region and a select transistor region are defined;
   etching the semiconductor substrate in the select transistor region to form a first step between the cell region and the select transistor region; and,
   forming a cell gate in the cell region, and forming a transistor in the select transistor region.

2. The method of claim 1, wherein a width of the etched select transistor region 4 to 6 times larger than that of the transistor.

3. The method of claim 1, wherein the first step has a height ranging from 300 Å to 1000 Å.

4. The method of claim 1, wherein the first step has a slope between the transistor and the cell gate adjacent to the transistor.

5. The method of claim 4, comprising controlling the angle of the slope depending on a polymer formation method and a corresponding amount of polymer used when etching the semiconductor substrate.

6. The method of claim 1, wherein the cell gate has a stacked structure comprising a floating gate, a dielectric layer and a control gate.

7. The method of claim 6, comprising forming the floating gate from a polysilicon layer by in-situ implanting a P or B dopant into a source gas.

8. The method of claim 7, wherein the source gas is selected from the group consisting of $SiH_4$, $Si_2H_6$, and $SiH_2Cl_2$.

9. The method of claim 6, comprising forming the cell gate in the cell region and the transistor in the select transistor region at the same time.

10. The method of claim 1, further comprising, after forming the cell gate and the transistor, the steps of:
    forming spacers on sidewalls of the cell gate and the transistor;
    forming a first insulating layer over the semiconductor substrate including the spacers, the cell gate and the transistor;
    etching the first insulating layer to form a source contact plug;
    forming a second insulating layer on the first insulating layer and the source contact plug; and,
    etching the second insulating layer and the first insulating layer to form a drain contact plug.

11. The method of claim 10, further comprising forming an insulating layer over the semiconductor substrate including the spacers, the cell gate and the transistor before the first insulating layer is formed.

12. The method of claim 10, wherein the formation of the first insulating layer and the formation of the second insulating layer has a second step between the select transistor region and the cell region.

* * * * *